United States Patent [19]

Bernier

[11] 4,086,531
[45] Apr. 25, 1978

[54] ELECTRICAL SYSTEM TEST APPARATUS

[75] Inventor: Donald R. Bernier, Lake Orion, Mich.

[73] Assignee: Compunetics, Incorporated, Troy, Mich.

[21] Appl. No.: 680,484

[22] Filed: Apr. 26, 1976

[51] Int. Cl.² .................. G01R 31/02; G01R 19/16
[52] U.S. Cl. ....................... 324/158 MG; 324/15
[58] Field of Search .......... 324/158 MG, 15; 322/99, 322/28; 340/248 V, 249

[56] References Cited

U.S. PATENT DOCUMENTS

| | | | |
|---|---|---|---|
| 3,409,824 | 11/1968 | Makuh | 324/15 |
| 3,629,704 | 12/1971 | Stevens | 324/158 MG |
| 3,893,029 | 7/1975 | Vensel et al. | 324/158 MG |
| 4,019,120 | 4/1977 | Fattic | 324/158 MG |

*Primary Examiner*—Rudolph V. Rolinec
*Assistant Examiner*—Ernest F. Karlsen
*Attorney, Agent, or Firm*—Harness, Dickey & Pierce

[57] ABSTRACT

An alternator-battery electrical system test apparatus which, in one modification, includes a four stage voltage level sensing system, each stage being operative in response to a particular condition of the electrical system under test. The first stage senses the filtered and unfiltered output of the alternator to provide a pulsed output which provides an indication of any diode failure or winding failure in the alternator. The remaining three stages sense the voltage output from the alternator as compared to a fixed reference, each particular voltage condition providing an indication of a preselected electrical condition within the circuit. The entire system is calibrated by a single calibrating resistor. The second modification of the system provides two outputs, one output indicating a regular defect and a diode condition indicator and the other indicator providing an indication of no defects in the system if conducting alone, or an alternator defect if conducting simultaneously with the above mentioned one output. The circuit is substantially identical to the first modification, with certain elements eliminated.

29 Claims, 2 Drawing Figures

ELECTRICAL SYSTEM TEST APPARATUS

BACKGROUND OF THE INVENTION

A. Field of the Invention

This invention relates to a charging system test apparatus and, more particularly, to a system for detecting the malfunctioning and defective circuit elements of an automotive, alternator-battery, electrical system by analyzing the filtered and unfiltered output from the alternator and the voltage level at the output of the alternator under certain conditions.

B. Description of the Prior Art

With the advent of the alternator-battery charging systems in lieu of the generator-battery charging systems, a need has arisen for an apparatus for testing the various components of the alternator-battery charging system. The basic difference between the alternator and generator is the fact that a generator produces direct current which is regulated and fed to the electrical system of the vehicle and to the battery for charging purposes. The alternator, on the other hand, produces alternating current which is rectified by a diode rectifying system to produce pulsating direct current which, in turn, is fed to the electrical system and battery for charging purposes. Accordingly, it is necessary to provide a test system which will not only test the battery condition but also will test the condition of the diodes, the alternator field, and the regulator system.

Systems have been previously evolved for testing the condition of various elements within the automotive electrical system. However, the majority of these systems require a plurality of selective connections to various elements in the charging circuit between the alternator and the battery, including the regulator circuit. Such systems require a certain degree of skill on the part of the operator to properly select the connections to be made and to be able to properly correlate the output reading encountered with the readings expected under normal operation. Even at this point, the operator requires skill to make a determination as to which components of the alternator-battery system are malfunctioning.

Further, these prior systems are, in certain circumstances, of the type which require actual interruption of the vehicle wiring. Accordingly, further skill is required in knowing which wires to remove and reconnect to insure proper operation of the test system. Additionally, certain of these systems require a separate power supply from that within the automobile. Accordingly, these separate supply systems must be plugged into a convenience outlet or a direct current supply included within the apparatus. These systems are inconvenient to use if a convenience outlet is not available and, in the case of a battery supply, require constant changing of batteries and testing of batteries within the system to ensure that the voltage level of the power supply is sufficient before the tests are conducted.

A further system for testing an alternator-battery charging system has been provided in the prior art which includes an apparatus for analyzing the waveform and magnitude of the ripple voltage superimposed on the alternator output, which ripple characteristics are indicative of whether or not the alternator is operating normally. Circuitry is provided to energize indicator lights in responsive to certain detected ripple characteristics, thereby providing an unambiguous indication of the operational status of the alternator. Further, circuitry is provided to sense the voltage at the alternator field terminal to determine if malfunctioning of the voltage regulator is present. This system is disclosed in United States Letters Patent 3,629,704, patented Dec. 21, 1971.

SUMMARY OF THE INVENTION

Referring now to the system of the present invention, which is designed to reduce the magnitude of the problems noted above, the input terminals of the system are connected to the positive terminal of the alternator and a negative terminal of the power supply, one of which forms the ground for the electrical system of the automobile. The positive terminal feeds unfiltered rectified voltage and current to the test system of the present invention through a protection device, in the form of a diode, and the negative terminal is connected to a common conductor for the entire system. This unfiltered voltage is fed to a common conductor and to a filtering diode, this latter diode being interconnected with a peak storage capacitor for storing the peak voltage produced by the alternator. This voltage on the capacitor is fed to a common conductor within the measuring circuit, the circuit providing very little drain from the capacitor thereby maintaining the voltage on the capacitor. This filter voltage is also fed to a reference voltage generating device, in the form of a zener diode, which provides a reference voltage for three of the four stages of the measuring circuit.

The measuring circuit includes four stages of measuring devices in the form of operational amplifiers connected as differential amplifiers. The first stage is provided an input to the positive terminal thereof from the unfiltered common conductor and the negative terminal is connected to a voltage divider connected across the filtered common conductor and the ground conductor. Thus, the first stage provides a pulsed output which, when the input voltage differential is of sufficient magnitude, will provide an output indication of the voltage differential through a light-emitting diode connected between the unfiltered common conductor and the output of the first stage operational amplifier.

The second, third and fourth stages, as noted above, are also differentially connected, operational amplifiers, one input of which is connected to the reference voltage circuit including the zener diode. This provides the basis for comparison between the voltage generated by the alternator on a transient basis and a steady reference voltage. The reference voltage generating circuit includes a variable voltage divider which is common to the three measuring stages to be discussed. Thus, a single calibration is provided for all three measuring stages.

In an alternative embodiment of the invention, certain features of the preferred embodiment have been combined into a system having two indicators. In the case of testing for regulator defects, the first indicator is illuminated or, in the case of alternator defects, the indication is provided by both indicator devices being illuminated. In the situation where the unit is without defect, the second indicator noted above is illuminated. Otherwise, the modified unit is substantially similar to the preferred embodiment.

Accordingly, it is one object of the present invention to provide an improved alternator-battery test system.

It is another object of the present invention to provide an improved alternator-battery test system which senses the voltage level being produced from the alternator and provides output indications determined by the voltage level measured.

Still another object of the present invention is to provide an improved charging system analyzer which detects the malfunctioning of either the alternator or voltage regulator by sensing the voltage level at the input to the analyzer, the voltage level providing an indication of a fault within the system.

It is still a further object of the present invention to provide an improved alternator-battery charging system test apparatus which includes a single adjustment for calibrating the entire test apparatus.

It is a further object of the present invention to provide an improved test apparatus for battery charging systems which is unambiguous in its indication of faults within the system.

It is still another object of the present invention to provide an improved battery charging system test apparatus which may be connected and disconnected with the charging system without altering or disconnecting any of the existing electrical wiring of the charging system.

It is still another object of the present invention to provide an improved battery charging system test apparatus which is powered by the battery being charged rather than an auxillary power supply.

It is still a further object of the present invention to provide an improved modification of the system described above which includes a simplified form of output indicators wherein one or two indicators may be utilized to provide an output indication of a fault.

It is still a further object of the present invention to provide an improved alternator-battery charging system test apparatus which is inexpensive to manufacture, easy to operate and reliable in use.

Other objects, features and advantages of the present invention will become readily apparent upon a study of the following specification and the attached drawings in which:

FIG. 1 is a schematic diagram illustrating a preferred embodiment of the alternator-battery charging system test aparatus; and FIG. 2 is a modification of the preferred form of FIG. 1 illustrating the simplified version of the system of the present invention.

DESCRIPTION OF THE PREFERRED EMBODIMENT AND MODIFICATION THEREOF

Figure 1:
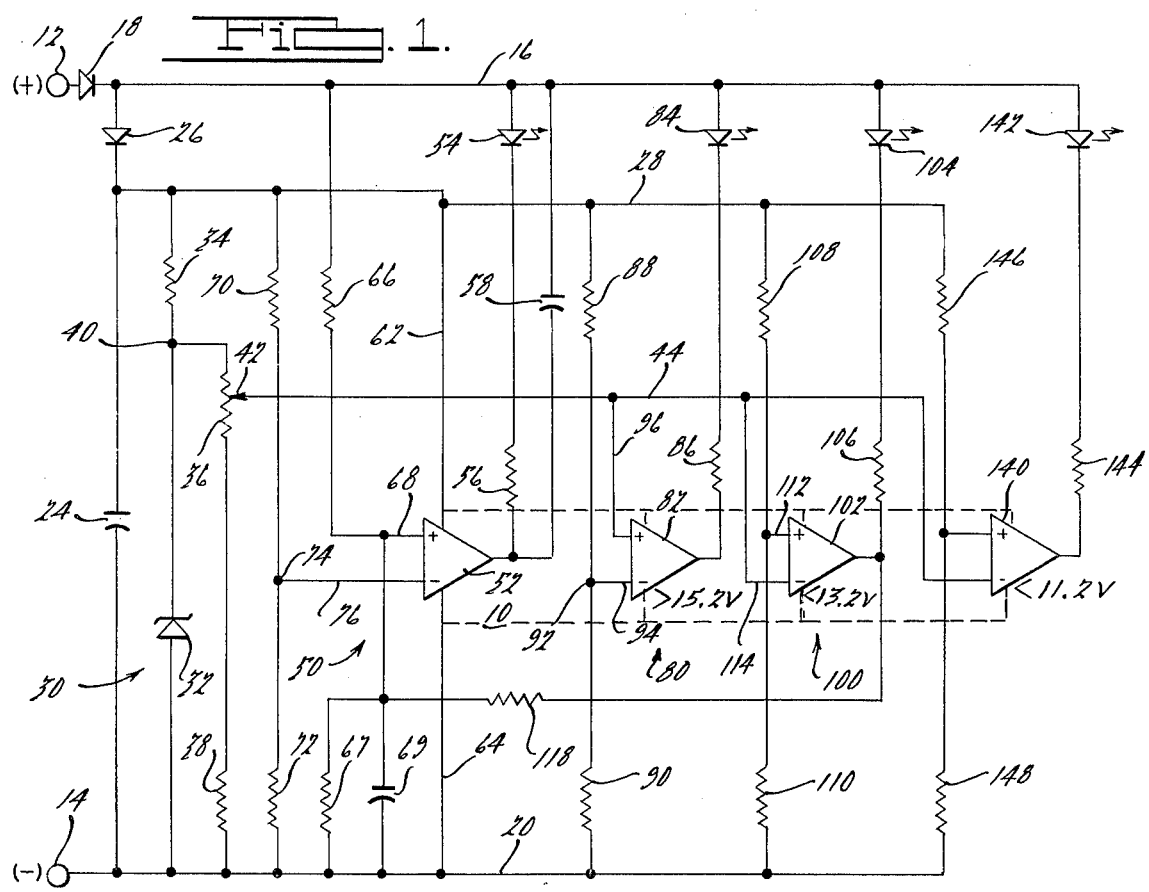

Referring now to FIG. 1, there is illustrated a test apparatus 10 which is adapted to be interconnected with the alternator of the alternator-battery charging system in, for an example, an automobile. The system includes a static test procedure and a running test procedure, the former occurring with the engine off and the latter occurring with the engine on.

In the static test procedure, the connector to the alternator is interconnected with the positive terminal of the test apparatus. The ground terminal is connected to the ground for the automobile. Of course, this assumes that the system under test is a negative ground, it being understood that a positive ground system may also be tested. The engine is left off and the low beam headlamps are turned on. Under these conditions, one of the indicators (in this case the second indicator) should be illuminated to indicate that the battery circuit is functioning properly. In the case of the system of the present invention, the final output stage (indicator four) tests the battery cells and if a cell in the battery is shorted or otherwise malfunctioning, the final output stage of the system will be illuminated. In the system of the present invention, the second and fourth indicator will be illuminated to indicate a battery fault.

The running test is performed by starting the engine and turning the low beam headlamps on. In order to test the alternator/regulator portion of the system, the engine is run at a high idle, in the area of the 1,000 to 2,000 RPM. If all of the indicators on the tester are off, the alternator/regulator system is normal. If the first indicator is illuminated, an overvoltage condition is signalled indicating a defective regulator. If the second indicator is illuminated, the system is not charging and a full field check should be performed, as will be more fully explained hereinafter.

In a situation where the second and third indicators are illuminated, the alternator is defective and the system should be checked for an open or shorted rectifier and/or grounded stator. If the second and fourth are illuminated, the system is not charging and a low battery condition is indicated. If only the third indicator is illuminated, a bad alternator is signalled and the alternator should be checked for an open or shorted rectifier and/or an open stator.

If, in the checks above, the second indicator is energized or indicators two and four are energized, the full field check should be performed by applying full field current to the alternator. If indicator two stays on, the alternator has an open field circuit. If indicator two goes out, the regulator or field wire to the alternator is defective.

In order to test the diode trio, the lead is removed from the alternator output stud and connected to the diode trio terminal. The engine is again operated at high idle (1,000 to 2,000 RPM) with the low beam headlamps turned on. If none of the indicators are illuminated, the diode trio is good. However, if indicator number three is illuminated, a defective diode trio is indicated.

In the system 10 of FIG. 1, the output stud on the alternator (not shown) is connected to the input terminal 12, and the negative terminal 14, in the situation illustrated, is connected to ground. The terminal 12 supplies unfiltered energy from the alternator to a common conductor 16 through a reverse polarity protection diode 18. Similarly, the ground potential is provided to a common conductor 20 connected to the terminal 14. The unfiltered voltage at conductor 16 is fed to a smoothing capacitor 24 through a diode 26, the charge on capacitor 24 being built up to the peak voltage from the alternator.

The peak voltage on capacitor 24 is fed to a second common conductor 28, the voltage impressed on conductor 28 being the filtered peak voltage stored on capacitor 24. This voltage is also fed to a constant voltage generation circuit 30, including a zener diode 32, a resistor 34, a potentiometer 36 and a resistor 38. The unfiltered voltage on conductor 28 is fed to the zener diode 32 through the resistor 34, the voltage being impressed on the zener diode 32 being in excess of the zener diode 32. Thus, a constant voltage is fed between conductor 20 and a node 40. A portion of this voltage is picked off by means of a slider 42 and fed to a conductor 44 which is common to the final three output stages of the system 10. The voltage on the conductor 44 determines the threshold of the three output stage comparators to be discussed hereinafter.

Referring now to the first indicator stage 50, there is provided an integrated circuit operational amplifier 52 connected in a differential amplifier configuration. The output of the amplifier 52 is of the pulsating type and causes a light-emitting diode 54 to conduct because of the flow of electrical energy from the conductor 16 through a resistor 56 to the output of amplifier 52. The output of the differential amplifier 52 is integrated by means of an integrating capacitor 58 connected across the light-emitting diode 54 and the resistor 56.

Normal connections are made from the differential amplifier 52 to a positive source of potential by means of a conductor 62 and to a negative source of potential at conductor 20 by means of a conductor 64. (Amplifier 52 is one of four identical amplifiers including 82, 103 and 140 available in a single package in which all four of the amplifiers are biased by known common input circuitry available in the package. The common input circuitry for 52, 82, 102 and 140 is shown by the dashed lines leading to conductors 62 and 64.) The differential amplifier 52 senses the difference between (1) a percentage of the unfiltered voltage at conductor 16 sensed by means of voltage divider resistors 66, 67 and a conductor 68 connected to the (positive) non-inverting input of operational amplifier 52, and (2) a percentage of the filtered input at conductor 28 as sensed by a voltage divider formed by resistors 70, 72 connected across the filtered input between conductors 28, 20, this being the voltage stored in capacitor 24. The midpoint 74 between the resistors 70, 72 is connected to the (negative) inverting input of operational amplifier 52 by means of a conductor 76. The (positive) non-inverting input is supplied voltage through the voltage divider including the resistor 66 and the resistor 67, the midpoint between the resistors 66, 67 being connected to the (positive) non-inverting input of the operational amplifier 52 by means of a conductor 68. The voltage across the resistor 67 is noise filtered by means of a cpacitor 69. All of the resistors 66, 67, 70, 72 are extremely precise resistors (±1%) to insure a sharp switch-over point for operational amplifier 52.

Thus, when the voltage being supplied conductors 68 and 76 is of such a magnitude and polarity, the operational amplifier 52 will lower its output voltage to cause conduction through the light-emitting diode 54. This conduction indicates a diode failure, either open or short, in the alternator unit itself.

Referring now to the next stage 80, there is illustrated an operational amplifier 82 connected as a differential amplifier, the output of which is connected to a light-emitting diode 84 through a resistor 86. As was the case above, the light-emitting diode 84 is connected to the common conductor 16 at one end thereof, and the other end is connected to the output of the operational amplifier 82 to cause energization of the light-emitting diode 84 in response to the lowering of the output voltage of the operational amplifier 82. The light-emitting diode 84 indicates an overcharged condition which is due to either the full field voltage being impressed across input terminals 12, 14 or the field is not regulated properly.

This condition is sensed by means of a voltage divider circuit including a resistor 88 and a resistor 90 connected between the common conductors 20 and 28. The center point 92 between the resistors 88 and 90 is connected to the (negative) inverting input of the operational amplifier 82 by means of a conductor 94. The (positive) non-inverting input is connected to the common conductor 96 to provide the reference voltage for the operational amplifier 82.

Accordingly, if the voltage at the input conductor 28 exceeds 15.2 volts, as indicated next to the operational amplifier 82, the operational amplifier will cause current flow through the light-emitting diode 84 to indicate an overcharging condition. This overcharging is indicative of a shorted regulator or full field voltage being impressed at the input terminal 12.

Referring to the next stage 100, it is seen that the state 100 includes an operational amplifier 102 which is again connected as a differential amplifier. The output of the operational amplifier 102 is connected to a light-emitting diode 104 through a resistor 106, the output voltage condition of the operational amplifier 102 determining the current flow through the light-emitting diode 104.

This (positive) non-inverting input to the operational amplifier 102 is connected to the center point of a voltage divider which includes a pair of resistors 108, 110 connected between conductors 28 and 20. The center point is connected to the (positive) non-inverting input of the operational amplifier 102 by means of a conductor 112. The (negative) inverting input of the operational amplifier 102 is connected to the reference voltage conductor 44 by means of a conductor 114. The output terminal of the operational amplifier 102 is also connected to the filter capacitor 69 by means of a resistor 118.

Accordingly, if the input voltage is less than 13.2 volts, the input voltage being fed to the (positive) non-inverting and (negative) inverting input terminals of operational amplifier 102 will be such that the output thereof will drop below the voltage at conductor 16 to cause current to flow through the light-emitting diode 104. This condition indicates that the battery is not sufficiently charging due to a lack of output from the alternator.

Referring now to the final output stage, there is illustrated an operational amplifier 140, the output of which is connected to a light-emitting diode 142 through a resistor 144. The input of the operational amplifier, which is connected as a differential amplifier, is connected to the common conductor 44 at the (negative) inverting terminal thereof and to a voltage divider, including a resistor 146 and a resistor 148 at the (positive) non-inverting terminal thereof. The operational amplifier 140 is connected to provide an output signal when the voltage at terminal 12 drops below 11.2 volts to indicate a bad cell in the battery being charged.

Figure 2:
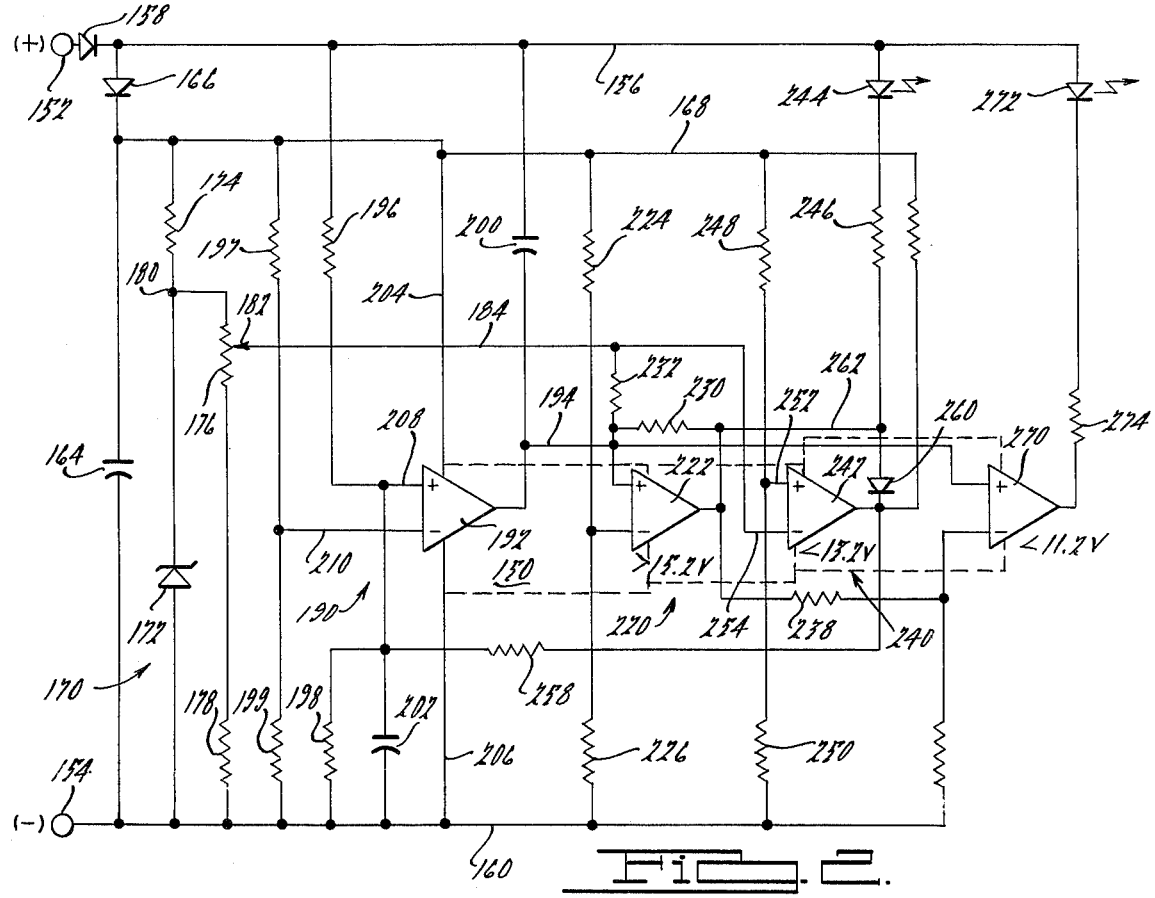

Referring now to FIG. 2, there is illustrated a modified form 150 of the system 10 of FIG. 1, the output stud on the alternator (not shown) being connected to an input terminal 152 and the negative terminal 154, in the situation illustrated, being connected to ground. The terminal 152 supplies unfiltered energy from the alternator to a common conductor 156 through a reverse polarity protection diode 158. Similarly, the ground potential is provided to a common conductor 160 connected to the terminal 154. The unfiltered voltage at conductor 156 is fed to a smoothing capacitor 164 through a diode 166, the charge on capacitor 164 being built up to the peak voltage from the alternator.

The peak voltage on capacitor 164 is fed to a second common conductor 168, the voltage being impressed on conductor 168 being the filtered peak voltage stored on capacitor 164. This voltage is also fed to a constant voltage generation circuit 170 including a zener diode 172, a resistor 174, a potentiometer 176 and a resistor 178. The potentiometer 176 is used as a calibration potentiometer for all of the output stages to be discussed. The unfiltered voltage on conductor 168 is fed to the zener diode 172 through the resistor 174, the voltage being impressed on the zener diode 172 being an excess of the avalanche voltage of the zener diode 172. Thus, a constant voltage is fed between conductor 160 and a node 180. A portion of this voltage is picked off by means of a slider 182 and fed to a conductor 184 which is common to the final three output stages of the system 150. The voltage on the conductor 184 determines the threshold of the output stage comparators to be discussed hereinafter.

Referring now to a first stage 190, there is provided an integrated circuit operational amplifier 192 connected in a differential amplifier configuration. The output of the amplifier 192 is pulsating in nature and supplies an output signal on conductor 194 as a result of a signal fed to the positive input thereof from an unfiltered voltage divider including resistor 196 connected to the conductor 156 and a resistor 198 connected to the conductor 160. A capacitor 200 is connected between the output of amplifier 192 and conductor 156 to form a bypass path. Normal connections are made from the differential amplifier 192 to a positive source of potential by means of a conductor 204 and to a negative source of potential at conductor 160 by means of a conductor 206. (Amplifier 192 is one of four identical amplifiers including 222, 242 and 270 available in a single package in which all of the amplifiers are biased by known common input circuitry available in the package. The common input circuitry for 192, 222, 242 and 270 and shown by the dashed lines leading to conductors 204 and 206.) Also, a capacitor 202 is provided for smoothing. The differential amplifier 192 senses the difference between the unfiltered voltage at conductor 156 and the filtered voltage at conductor 168. The unfiltered voltage is fed to the (positive) non-inverting input connected to divider resistors 196, 198 and the filtered voltage is fed to the (negative) inverting input of operational amplifier 192 by means of a voltage divider including resistors 197, 199 connected between conductors 168 and 160.

Thus, when the voltage being supplied input conductors 208, 210 is of such a magnitude and polarity, the operational amplifier 192 will lower its output voltage to lower the signal level on conductor 194. This lowering of the output of operational amplifier 192 indicates a diode failure, either open or short, in the alternator unit itself as described in conjunction with FIG. 1. However, in this modification, the signal is fed to modify the input signals to the second and fourth stages to be described.

Referring now to the next stage 220, there is illustrated an operational amplifier 222 connected as a differential amplifier, the output of which is connected to the (negative) inverting input of the fourth stage to be described. The input to the (negative) inverting terminal of amplifier 222 is provided by a connection to an overvoltage divider, including resistors 224, 226 connected between conductors 160, 168 to provide a filtered supply. On the other hand, the (positive) non-inverting input is connected to the output of amplifier 192, by means of conductor 194. The output of amplifier 222 is connected to the (positive) non-inverting input by means of a feedback resistor 230, the left side of which is connected to the calibrating source at conductor 184 by means of a resistor 232. Thus, the amplifier senses when the overvoltage divider generates a signal indicating that the difference between the negative conductor 160 and the filtered voltage at conductor 168 exceeds, in this case, 15.2 volts.

Accordingly, if the voltage at the input conductor 168 exceeds 15.2 volts, as indicated next to the operational amplifier 222, the operational amplifier will cause current flow toward the fourth output stage by means of a resistor 238 to indicate an overcharging condition. This overcharging is indicative of a shorted regulator or full field voltage being impressed at the input terminal 152.

Referring to the next stage 240, it is seen that the stage 240 includes an operational amplifier 242 which is again connected as a differential amplifier. The output of the operational amplifier 242 is connected to a light-emitting diode 244 through a resistor 246, the output voltage condition of the operational amplifier 242 determining the current flow through the light-emitting diode 244.

Thus (positive) non-inverting input to the operational amplifier 242 is connected to the center point of a voltage divider which includes a pair of resistors 248, 250 connected between conductors 168 and 160. The center point is connected to the (positive) non-inverting input of the operational amplifier 242 by means of a conductor 252. The (negative) inverting input of the operational amplifier 242 is connected to the reference voltage conductor 184 by means of a conductor 254. The output terminal of the operational amplifier 242 is also connected to the filter capacitor 202 by means of a resistor 258. A diode 260 is also provided at the output of operational amplifier 242 to preclude current flow from amplifier 242 through the conductor 262.

Accordingly, if the input voltage is less than 13.2 volts, the input voltage being fed to the (positive) non-inverting and (negative) inverting input terminals of operational amplifier 242 will be such that the output thereof will drop below the voltage at conductor 156 to cause current to flow through the light-emitting diode 244. This condition indicates that the battery is not sufficiently charging due to a lack of output from the alternator due to a diode defect in the alternator or to indicate a regulator malfunction.

Referring now to the final output stage, there is illustrated an operational amplifier 270, the output of which is connected to a light-emitting diode 272 through a resistor 274. The (positive) non-inverting input of the operational amplifier 270, which is connected as an inverter differential amplifier, is connected to the output of amplifier 192 by means of a conductor 276 and the conductor 194. It will be recalled that the signal level on conductor 194 dropped when the filtered voltage level average dropped sufficiently below the unfiltered voltage peaks to cause the amplifier 192 to conduct. The (negative) inverted input to amplifier 270 is supplied by the output of amplifier 222 which senses when an overvoltage condition exists, that is, greater than 15.2 volts.

The operational amplifier acts as an inverter and, as such, will cause conduction through diode 272 when the input signal levels indicate no fault with the difference between the filtered and unfiltered voltage and no overvoltage condition. This assumes that diode 244 is not conducting; and, under this assumption the circuit will indicate a functioning alternator and regulator.

If, on the other hand, diodes 244 and 272 are conducting current, this indicates an alternator defect because nothing is wrong with the filtered and unfiltered situation at the input to amplifier 192 and there is a low voltage condition at the input to amplifier 242. Thus a problem exists with the alternator. This modification provides a simple and low cost readout for the common problems encountered in alternator-battery charging systems. In this case, the operator need only observe two light sources to obtain a readout on the most common defects which exist.

In a preferred embodiment of the invention, the following circuit elements were chosen and proved to operate satisfactorily:

| Resistors | Value | Capacitor | Value |
|---|---|---|---|
| 34 | 2.2K | 24 | 33MFD |
| 36 | 2K or 50K | 58 | 10MFD |
| 38 | 16.5K or 200K | 69 | 220PFD |
| 56 | 2.2K | 164 | 33MFD |
| 66* | 196K | 200 | .01MFD |
| 67* | 220PFD | 202 | 220PFD |
| 70* | 200K | | |
| 72* | 200K | | |
| 86 | 2.2K | | |
| 88* | 31.6K | | |
| 90* | 22.1K | | |
| 106 | 2.2K | | |
| 108* | 24.3K | | |
| 110* | 22.1K | Diodes | Designation |
| 118 | 1.8MEG | | |
| 144 | 2.2K | 18 | IN4007 |
| 146* | 17.4K | 26 | IN4007 |
| 148* | 22.1K | 32 | IN4735 |
| 174 | 2.2K | 158 | IN4007 |
| 176 | 2K or 50K | 166 | IN4007 |
| 178 | 16.5K or 200K | 172 | IN4735 |
| 196* | 196K | 260 | IN4148 |
| 197* | 200K | | |
| 198* | 200K | | |
| 199* | 200K | | |
| 224* | 31.6K | | |
| 226* | 22.1K | | |
| 230 | 22MEG | | |
| 232 | 100K | | |
| 238 | 220K | | |
| 246 | 2.2K | | |
| 248* | 24.3K | | |
| 250* | 22.1K | | |
| 258 | 1.8MEG | | |
| 274 | 2.2K | | |

While it will be apparent that the preferred embodiment of the subject invention disclosed herein is well calculated to fulfill the objects above stated, it will be appreciated that the invention is susceptible to modification, variation and change without departing from the proper scope or fair meaning of the subjoined claims.

What is claimed is:

1. In a test system for testing and analyzing an electrical system including an alternator assembly, a battery charged by the alternator assembly and connected thereto, and a regulator connected to the alternator assembly for controlling the charging of the battery, the alternator assembly including an alternator and a rectifier circuit whereby an output voltage is provided having a d-c voltage with a superimposed a-c ripple, the output voltage being provided at an output terminal on the alternator and an electrical ground, said system comprising a plurality of indicator circuits for indicating the condition of at least two of the alternator, rectifier circuit, regulator and/or battery, an input circuit means connected between the alternator assembly and the plurality of indicator circuits for providing an unfiltered voltage having an magnitude varying in accordance with the variations in magnitude of the d-c voltage and the a-c ripple, said input circuit means comprising only a single pair of lead conductors with one of said conductors adapted to be connected to the output terminal of the alternator and the other adapted to be connected to the electrical ground whereby said unfiltered voltage is provided by said pair of conductors without altering the alternator assembly, said input circuit means also providing a filtered voltage derived from said unfiltered voltage from said single pair of conductors and having a generally uniform magnitude varying in accordance with the magnitude of the output voltage, said input circuit means also providing a source of a reference voltage derived from said unfiltered voltage from said single pair of conductors and having a preselected magnitude less than and independent of the magnitude of the output voltage, said reference voltage being interconnected with at least some of said indicator circuits, one of said indicator circuits being connected to receive said unfiltered voltage and said filtered voltage for comparing said filtered voltage and said unfiltered voltage and providing an output indication when the magnitude of said filtered voltage and the magnitude of said unfiltered voltage including its a-c ripple bear a preselected relationship, one to the other, the remainder of said plurality of indicator circuits being connected as comparator circuits, one input to said remainder of said indicator circuits being connected to sense a preselected percentage of said filtered voltage and comparing that preselected percentage to said reference voltage, each of said remaining indicator circuits providing an output indication when said percentage bears a preselected relationship to said reference voltage to indicate selected faults in the alternator, regulator and/or the battery.

2. The system of claim 1 wherein said reference voltage is derived from said filtered voltage by a constant voltage device.

3. The system of claim 2 further comprising voltage divider means connected across said constant voltage device for providing said reference voltage.

4. The system of claim 3 wherein said voltage divider means includes variable means for varying the division of voltage across said constant voltage device, said variable means being connected to each of said remainder of said indicator circuits.

5. The system of claim 1 wherein one of said remainder of said indicator circuits includes first comparator circuit means having first and second input circuits, said reference voltage being connected to said first input circuit and said second input circuit being connected to receive said preselected percentage of said filtered voltage, said one indicator circuit providing an indication when said filtered voltage percentage exceeds said reference voltage by a preselected amount whereby excessive voltage output from the generator assembly is indicated.

6. The system of claim 5 wherein said one of said remainder of said indicator circuits indicates a fault in the regulator.

7. The system of claim 6 wherein a second of said remainder of said indicator circuits includes second comparator circuit means having third and fourth input circuits, said reference voltage being connected to said fourth input circuit and said third input circuit being connected to receive said preselected percentage of said filtered voltage, said second indicator circuit providing an indication when said filtered voltage percentage is less than said reference voltage by a preselected amount whereby a deficient voltage output from the generator assembly is indicated.

8. The system of claim 7 wherein said second of said remainder of said indicator circuits indicates a fault in the alternator.

9. The system of claim 8 wherein a third of said remainder of said indicator circuits includes third comparator circuit means having fifth and sixth input circuits, said reference voltage being connected to said sixth input circuit and said fifth input circuit being connected to receive said preselected percentage of said filtered voltage, said third indicator circuit providing an indication when said filtered voltage percentage is less than said reference voltage by a preselected amount whereby a deficient battery voltage is indicated.

10. The system of claim 9 wherein said third of said remainder of said indicator circuits indicates a fault in the battery.

11. In a test system for testing and analyzing an electrical system including an alternator assembly, a battery charged by the alternator assembly and connected thereto, and a regulator connected to the alternator assembly for controlling the charging of the battery, the alternator assembly including an alternator and a rectifier whereby an output voltage is provided having a d-c voltage with a superimposed a-c ripple, the output voltage being provided at an output terminal on the alternator and an electrical ground, said test system comprising a plurality of indicator circuits for indicating the condition of at least two of the alternator, rectifier circuit, regulator and/or battery, an input circuit means connected between the alternator assembly and the plurality of indicator circuits for providing an unfiltered voltage having a magnitude varying in accordance with the variations in magnitude of the d-c voltage and the a-c ripple, said input circuit means comprising only a single pair of lead conductors with one of said conductors adapted to be connected to the output terminal of the alternator and the other adapted to be connected to the electrical ground whereby said unfiltered voltage is provided by said pair of conductors without altering the alternator assembly, said input circuit means also providing a filtered voltage derived from said unfiltered voltage from said single pair of conductors and having a generally uniform magnitude varying in accordance with the magnitude of the output voltage, said input circuit means also providing a source of a reference voltage derived from said unfiltered voltage from said single pair of conductors and having a preselected magnitude less than and independent of the magnitude of the output voltage, said input circuit means further providing a voltage single derived from said unfiltered voltage and having a magnitude varying in accordance with the variations in magnitude of the a-c ripple, said reference voltage being interconnected with at least some of said indicator circuits, one of said indicator circuits being connected to receive said voltage signal and providing an output indication when said voltage signal attains a preselected magnitude whereby said output indication will provide a signal indicating that the a-c ripple is excessive, the remainder of said plurality of indicator circuits being connected as comparator circuits, one input to said remainder of said indicator circuits being connected to sense a preselected percentage of said filtered voltage and comparing that preselected percentage to said reference voltage, each of said remaining indicator circuits providing an output indication when said percentage bears a preselected relationship to said reference voltage to indicate selected faults in the alternator, regulator and/or the battery.

12. In a test system for testing and analyzing an electrical system including an alternator assembly, a battery charged by the alternator assembly and connected thereto, and a regulator connected to the alternator assembly for controlling the charging of the battery, the alternator assembly including an alternator and a rectifier circuit whereby an output voltage is provided having a d-c voltage with a superimposed a-c ripple, the output voltage being provided at an output terminal on the alternator and an electrical ground, said test system comprising a plurality of indicator circuits for indicating the condition of at least two of the alternator, rectifier circuit, regulator and/or battery, an input circuit means connected between the alternator assembly and the plurality of indicator circuits for providing an unfiltered voltage having a magnitude varying in accordance with the variations in magnitude of the d-c voltage and the a-c ripple, said input circuit means comprising only a single pair of lead conductors with one of said conductors adapted to be connected to the output terminal of the alternator and the other adapted to be connected to the electrical ground whereby said unfiltered voltage is provided by said pair of conductors without altering the alternator assembly, said input circuit means also providing a source of a reference voltage derived from said unfiltered voltage from said single pair of conductors and having a preselected magnitude less than and independent of the magnitude of the output voltage, said input circuit means further providing a first voltage signal derived from said unfiltered voltage and having a magnitude varying in accordance with the variations in magnitude of the a-c ripple, said reference voltage being interconnected with at least some of said indicator circuits, one of said indicator circuits being connected to receive said first voltage signal and providing an output indication when said voltage signal attains a preselected magnitude whereby said output indication will provide a signal indicating that the a-c ripple is excessive, said input circuit means providing a plurality of second voltage signals derived from said unfiltered voltage, the remainder of said plurality of indicator circuits being connected as comparator circuits, one input to each of said remainder of said indicator circuits being connected to sense a preselected percentage of one of said second voltage signals and comparing that preselected percentage to said reference voltage, each of said remaining indicator circuits providing an output indication when said preselected percentage bears a preselected relationship to said reference voltage to indicate selected faults in the alternator, regulator and/or the battery.

13. The system of claim 12 wherein one of said indicator circuits first comparator circuit means having first and second input circuits, said reference voltage being connected to said first input circuit and said second input circuit being connected to receive said preselected percentage of one of said second voltage signals, said one of said indicator circuits providing an indication when said one of said second voltage signals percentage exceeds said reference voltage by a preselected amount whereby excessive voltage output from the generator assembly is indicated.

14. The system of claim 13 wherein a second of said indicator circuits includes second comparator circuit means having third and fourth input circuits, said reference voltage being connected to said fourth input circuit and said third input circuit being connected to receive said preselected percentage of another of said second voltage signals, said second indicator circuit providing an indication when said other of said voltage signals percentage is less than said reference voltage by a preselected amount whereby a deficient voltage output from the generator assembly is indicated.

15. The system of claim 14 wherein a third of said indicator circuits includes third comparator circuit means having fifth and sixth input circuits, said reference voltage being connected to said sixth input circuit and said fifth input circuit being connected to receive said preselected percentage of a different one of said second voltage signals, said third indicator circuit providing an indication when said different one of said second voltage signals percentage is less than said reference voltage by a preselected amount whereby a deficient battery is indicated.

16. The system of claim 15 with said second voltage signals being filtered voltages derived from said unfiltered voltage from said single pair of conductors with said filtered voltage having a generally uniform magnitude varying in accordance with the magnitude of the output voltage.

17. The system of claim 11 wherein said reference voltage is derived from said filtered voltage by a constant voltage device.

18. The system of claim 17 further comprising voltage divider means connected across said constant voltage device for providing said reference voltage.

19. The system of claim 18 wherein said voltage divider means includes variable means for varying the division of voltage across said constant voltage device, said variable means being connected to each of said remainder of said indicator circuits.

20. The system of claim 11, wherein one of said indicator circuits includes first comparator circuit means having first and second input circuits, said reference voltage being connected to said first input circuit and said second input circuit being connected to receive said preselected percentage of said voltage signal said one of said indicator circuits providing an indication when said voltage signal percentage exceeds said reference voltage by a preselected amount whereby excessive voltage output from the generator assembly is indicated.

21. The system of claim 20 wherein said one of said indicator circuits indicates a fault in the regulator.

22. The system of claim 21 wherein a second of said indicator circuits includes second comparator circuit means having third and fourth input circuits, said reference voltage being connected to said fourth input circuit and said third input circuit being connected to receive said preselected precentage of said voltage signal said second indicator circuit providing an indication when said voltage signal percentage is less than saif reference voltage by a preselected amount whereby a deficient voltage output from the generator assembly is indicated.

23. The system of claim 22 wherein said second of said indicator circuits indicates a fault in the alternator.

24. The system of claim 23 wherein a third of said indicator circuits includes third comparator circuit means having fifth and sixth input circuits, said reference voltage being connected to said sixth input circuit and said fifth input circuit being connected to receive said preselected percentage of said voltage signal said third indicator circuit providing an indication when said voltage signal percentage is less than said reference voltage signal by a preselected amount whereby a deficient battery voltage is indicated.

25. The system of claim 24 wherein said third of said indicator circuits indicates a fault in the battery.

26. The system of claim 12 wherein said input circuit means further provides a filtered voltage having a generally uniform magnitude varying in accordance with the magnitude of the output voltage and further includes a first voltage divider having said unfiltered voltage applied thereacross and a second voltage divider having said filtered voltage applied thereacross, said comparator circuit means having a first input circuit connected to said first voltage divider for receiving a preselected proportion of said unfiltered voltage and a second input circuit connected to said second voltage divider for receiving a preselected proportion of said filtered voltage.

27. The system of claim 26 wherein said first and second voltage dividers comprise a plurality of resistors of preselected values having close tolerances of approximately ±1%.

28. The system of claim 27 wherein said indicator circuit further includes an indication device, said comparator circuit means including an output circuit connected to said indicator device.

29. The system of claim 12 wherein all of its operating electrical energy is received from said alternator assembly, battery and/or regulator.

* * * * *

UNITED STATES PATENT AND TRADEMARK OFFICE
CERTIFICATE OF CORRECTION

PATENT NO. : 4,086,531
DATED : April 25, 1978
INVENTOR(S) : Donald R. Bernier

It is certified that error appears in the above-identified patent and that said Letters Patent are hereby corrected as shown below:

Column 6, line 10, delete "state" and substitute therefor --stage-- second occurrence.
Column 7, line 33, delete "and" and substitute therefor --are--.
Column 9, Chart, Add --*+1%--.
Column 11, line 23, (Claim 11), after "fier" insert --circuit--.
Column 11, line 50, (Claim 11), delete "single" and substitute therefor --signal--.
Column 14, line 6, (Claim 22), delete "saif" and substitute therefor --said--.

Signed and Sealed this

Third Day of October 1978

[SEAL]

Attest:

RUTH C. MASON
Attesting Officer

DONALD W. BANNER
Commissioner of Patents and Trademarks